United States Patent [19]
Nakamura et al.

[11] 3,977,023
[45] Aug. 24, 1976

[54] TAPE RECORDER
[75] Inventors: Shoichi Nakamura; Noriaki Naito, both of Tokyo, Japan
[73] Assignee: Sony Corporation, Tokyo, Japan
[22] Filed: June 21, 1974
[21] Appl. No.: 481,807

[30] Foreign Application Priority Data
June 28, 1973 Japan.......................... 48-76795[U]

[52] U.S. Cl..................................... 360/67; 360/61
[51] Int. Cl.².......................................... G11B 5/02
[58] Field of Search......................... 360/31, 61, 67

[56] References Cited
UNITED STATES PATENTS
3,379,959 4/1968 Kruszka............................... 360/67

Primary Examiner—James W. Moffit
Attorney, Agent, or Firm—Lewis H. Eslinger; Alvin Sinderbrand

[57] ABSTRACT

A tape recorder comprises a noise reducing circuit provided at its output side with a first switch for changing over the circuit from its operative condition to its inoperative condition and vice versa and a second switch operatively connected to the first switch and for changing over the signal level. The use of the noise reducing circuit causes a decrease of the standard point of the recording level and an increase of the standard point of the reproduction level so as to increase the dynamic range of the tape recorder.

8 Claims, 6 Drawing Figures

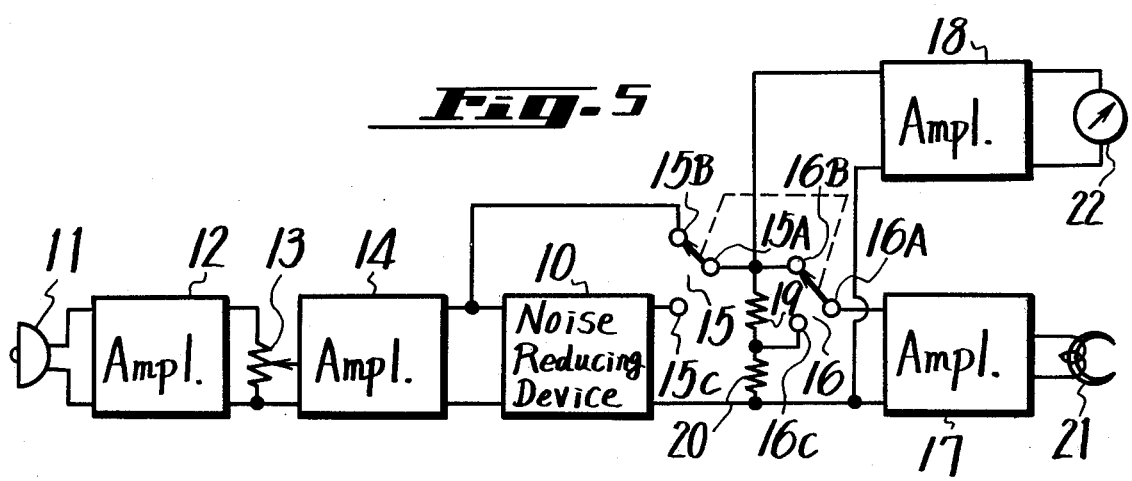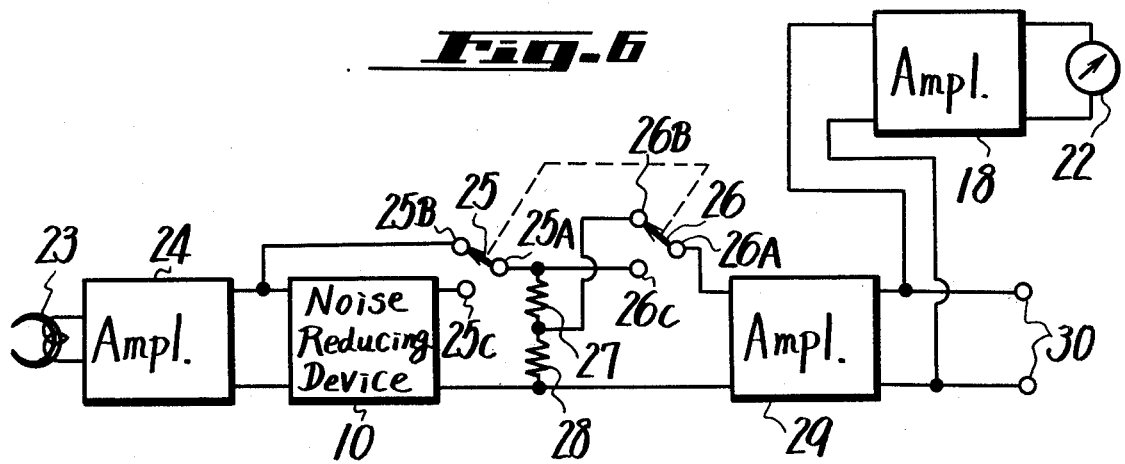

TAPE RECORDER

BACKGROUND OF THE INVENTION

1. Field of the Invention

This invention relates generally to a tape recorder, and more particularly to a tape recorder provided with a noise reducing circuit.

2. Description of the Prior Art

In general, the reproduction signal of a tape playback device includes tape noises such as hiss produced by the magnetic tape and the like. As a result, it is preferable to raise the recording level and lower the gain of the reproduction amplifier for the purpose of obtaining a reproduction signal having an excellent signal-to-noise ratio S/N.

However, if the recording level is raised uniformly, that part of the magnetic tape which receives a high level signal becomes saturated, thereby causing the reproduction signal to be distorted at the corresponding part of the magnetic tape. In addition, the higher the recording frequency the lower the saturation level of the magnetic tape.

SUMMARY OF THE INVENTION

An object of the invention is to provide a tape recorder which comprises a noise reducing circuit and which can widen a dynamic range thereof.

Another object of the invention is to provide a cassette tape recorder which comprises a noise reducing device and has a wide dynamic range which is substantially the same as that of an open reel tape recorder.

A feature of the invention is the provision of a tape recorder comprising a noise reducing circuit, a first switch for changing over the noise reducing circuit from its operative condition to its inoperative condition and vice versa, and a second switch operatively connected to the first switch for changing the recording level, whereby when the noise reducing circuit is operated, the recording level is lowered to, at most, a level which corresponds to the noise level to be reduced by the noise reducing device.

The other objects, features and advantages of the invention will now be apparent from the following description taken in conjunction with the accompanying drawings.

BRIEF DESCRIPTION OF THE DRAWINGS

FIG. 5 is a block diagram showing one embodiment of the invention applied to a recording circuit; and FIG. 6 is a block diagram showing one embodiment of the invention applied to a reproduction circuit.

DESCRIPTION OF THE PREFERRED EMBODIMENTS

Figure 1:
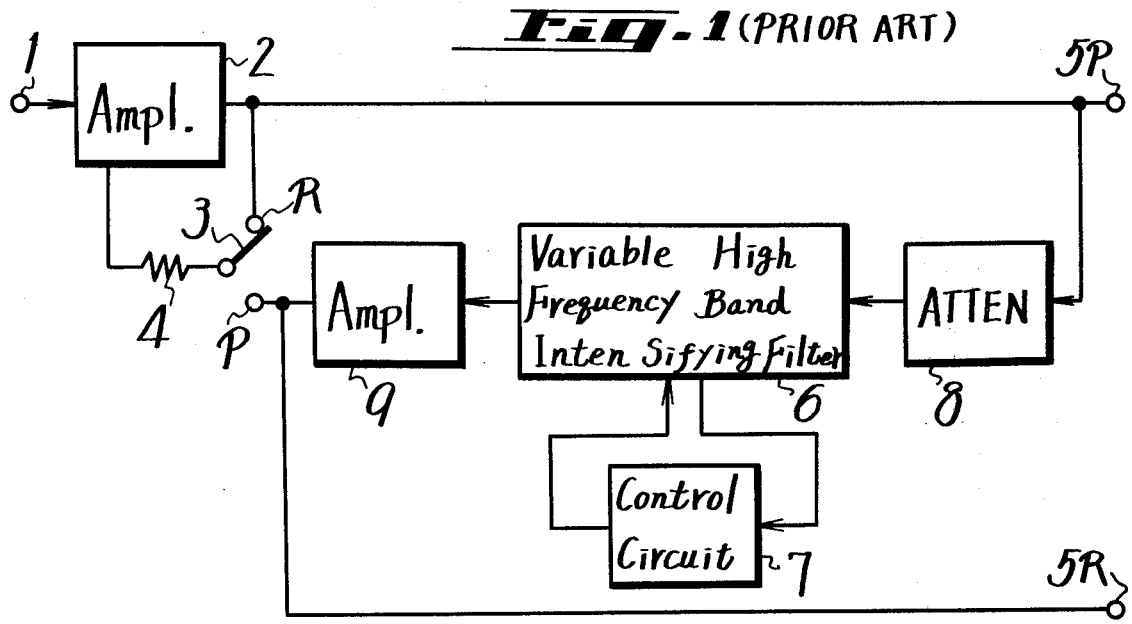
FIG. 1 is a block diagram showing a prior art noise reducing circuit for a tape recorder.

In FIG. 1 is shown a prior art noise reducing circuit for a tape recorder that takes the above general principle into consideration for the purpose of obtaining a reproduction signal having an excellent S/N.

Referring to FIG. 1, the circuit includes an input terminal 1 for recording and reproducing signals, a main amplifier 2, a recording and reproducing change-over switch 3, a negative feedback resistor 4 used during recording, a reproduction output terminal 5P, a recording terminal 5R, a variable high frequency band intensifying filter 6, a control circuit 7, an attenuator 8 which causes the level of a signal delivered to the filter 6 to be attenuated to a given level, and an amplifier 9 for compensating the level loss caused by the attenuator 8 and filter 6.

Figure 2:
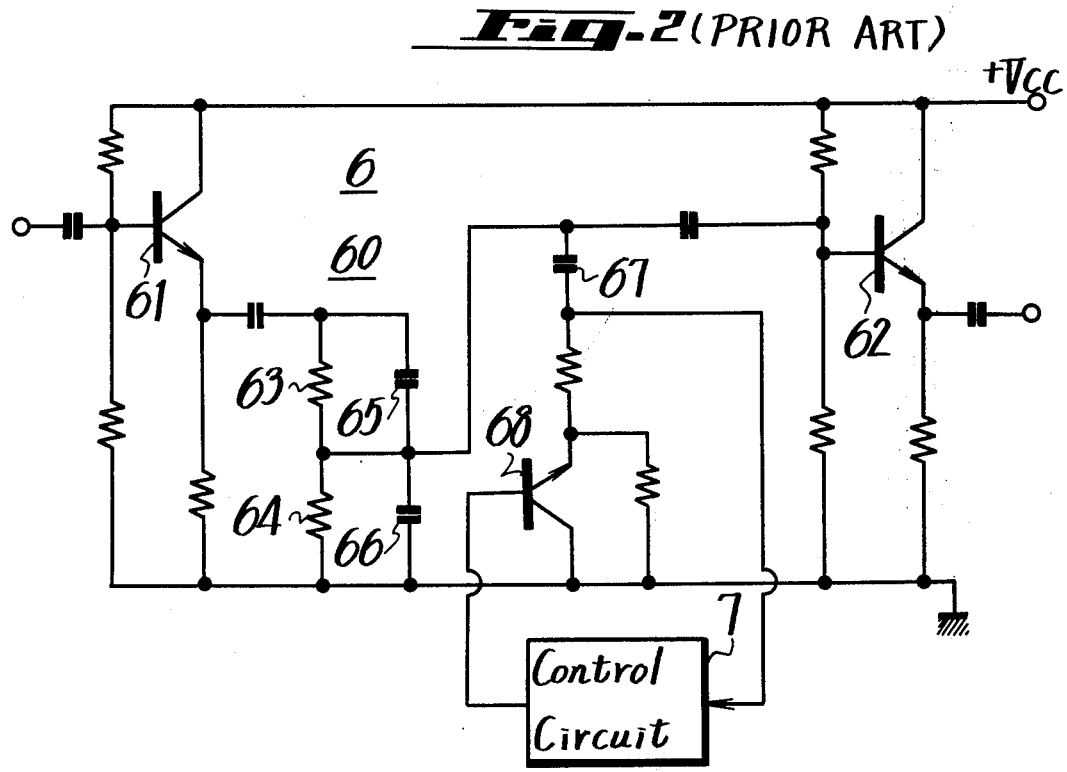
FIG. 2 is circuit diagram showing parts essential for the noise reducing device in FIG. 1.

As shown in FIG. 2, the filter 6 may be composed of emitter follower transistors 61 and 62, a high frequency band intensifying filter 60 connected across the transistors 61 and 62 and consisting of resistors 63, 64 and three condensers 65, 66, and a condenser 67, and a transistor 68 serving as a variable impedance element and connected to the output side of the filter 60.

Figure 3:
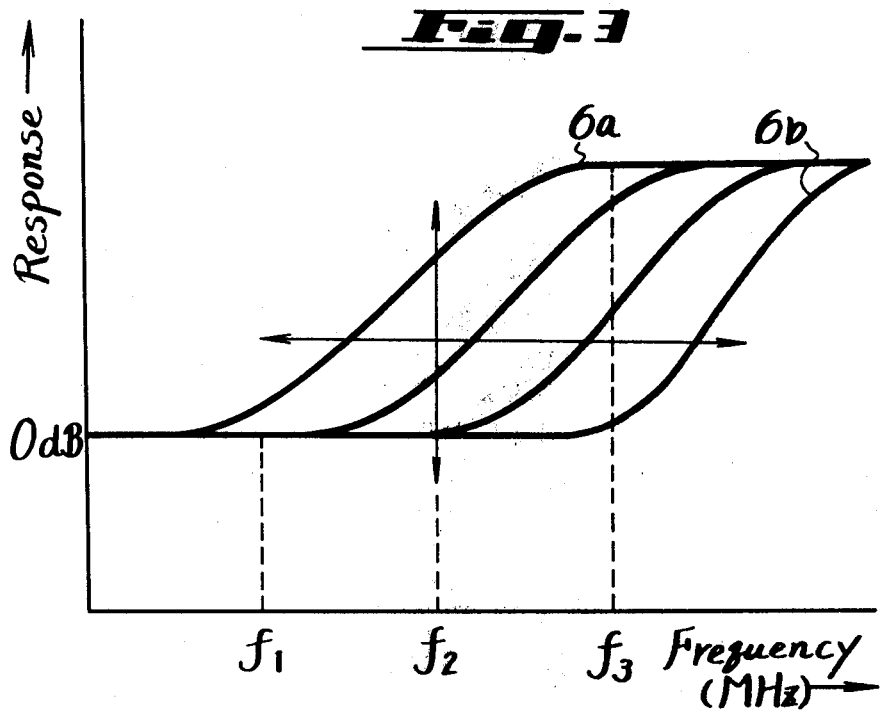
FIGS. 3 and 4 are graphs illustrating the operation of the noise reducing circuit shown in FIGS. 1 and 2.

If the level of a control signal supplied from the control circuit 7 to the filter 6 is low and the impedance of the transistor 68 is large, the roll off and turn-over frequencies of the filter 6 become low as shown by a curve 6a in FIG. 3. If the level of the control signal supplied from the control circuit 7 to the filter 6 is high and the impedance of the transistor 68 is small, the roll off and turn-over frequencies of the filter 6 become high as shown by a curve 6b in FIG. 3. That is, the higher the level of the control signal delivered from the control circuit 7 to the filter 6, the more the frequency-response characteristic of the filter 6 shifts away from the curve 6a toward the curve 6b. In addition, the control circuit 7 is connected to an output section of the filter 6 and the frequency characteristic of the control circuit 7 is of a high frequency band intensifying type. As a result, the higher the frequency band the higher the control sensitivity for the filter 6.

During recording, the switch 3 engages a recording contact R as shown in FIG. 1. The recording signal supplied to the terminal 1 is delivered through the amplifier 2, attenuator 8, filter 6, and amplifier 9 to the terminal 5R. If the frequency of the recording signal is low and equal to, for example, a frequency $f_1$ shown in FIG. 3, which is lower than 100Hz, the frequency response characteristic of the filter 6 is constant for the low frequency band irrespective of the level, or amplitude, of the control signal supplied from the control circuit 7. In addition, the control sensitivity of the control circuit 7 is low for the low frequency band so that the output signal at the terminal 5R is directly proportional to the input signal at the terminal 1 as shown by a straight line $R_1$ in FIG. 4.

If the frequency of the recording signal is in the intermediate frequency band, for example, around a frequency $f_2$ shown in FIG. 3 which is equal to 1KHz, the level of the control signal corresponds to the level of the recording signal. As a result, if the level of the recording signal is smaller than a given level $Gb$ shown in FIG. 4, the filter 6 has the frequency and response characteristic shown by a curve 6a in FIG. 3 so that the response of the filter 6 for the recording signal having the intermediate band frequency $f_2$ becomes large. If the level of the recording signal is higher than the given level $Gb$ shown in FIG. 4, the filter 6 has a frequency response characteristic shown by a curve 6b in FIG. 3 so that the response of the filter 6 for the recording signal having the intermediate band frequency $f_2$ is at a standard level, identified as 0dB. As a result, the input-output transfer characteristic between the terminals 1 and 5R for a recording signal having the frequency $f_2$ corresponds to a curve $R_2$ in FIG. 4. That is, if the level of the recording signal (the input level) is smaller than the given level G*b* and the frequency response characteristic of the filter 6 is of one shown by the curve 6*a* shown in FIG. 3, the input-output transfer characteristic between the terminals 1 and 5R becomes higher than the straight line $R_1$. If the level of the recording signal is larger than the level G*d*, the frequency response characteristic of the filter 6 is shown by the curve 6*b* shown in FIG. 3, and the input-output transfer characteristic between the terminals 1 and 5R is brought into in coincidence with the straight line $R_1$.

If the frequency of the recording signal is higher than, for example, $f_3$ which is shown in FIG. 3 and higher than 10KHz, the same operation as in the case of the intermediate band frequency $f_2$ is effected. As a result, the input-output transfer characteristic between the terminals 1 and 5R for the recording signal having the high frequency band $f_3$ becomes as shown by a curve $R_3$ in FIG. 4. That is, if the level of the recording signal (the input level) is smaller than the level G*b* the frequency and response characteristic of the filter 6 is shown by the curve 6*a*, the response of the filter 6 for the frequency $f_3$ is higher than the response of the filter 6 for the frequency $f_2$, so that the input-output transfer characteristic between the terminals 1 and 5R for the recording signal having the high frequency band is shown by a curve $R_3$ in FIG. 4. At an input signal level lower than the level G*a*, the output level becomes higher than the output level shown by the curve $R_2$, while at a level higher than a level G*c* the output level is brought into coincidence with the straight line $R_1$ in correspondence with the frequency response characteristic curve 6*b* of the filter 6. In this case, the control circuit 7 has a sensitivity which is higher at the higher frequency band than at the intermediate frequency band. That is, G*a* < G*b* and G*c* < G*d*.

Figure 4:
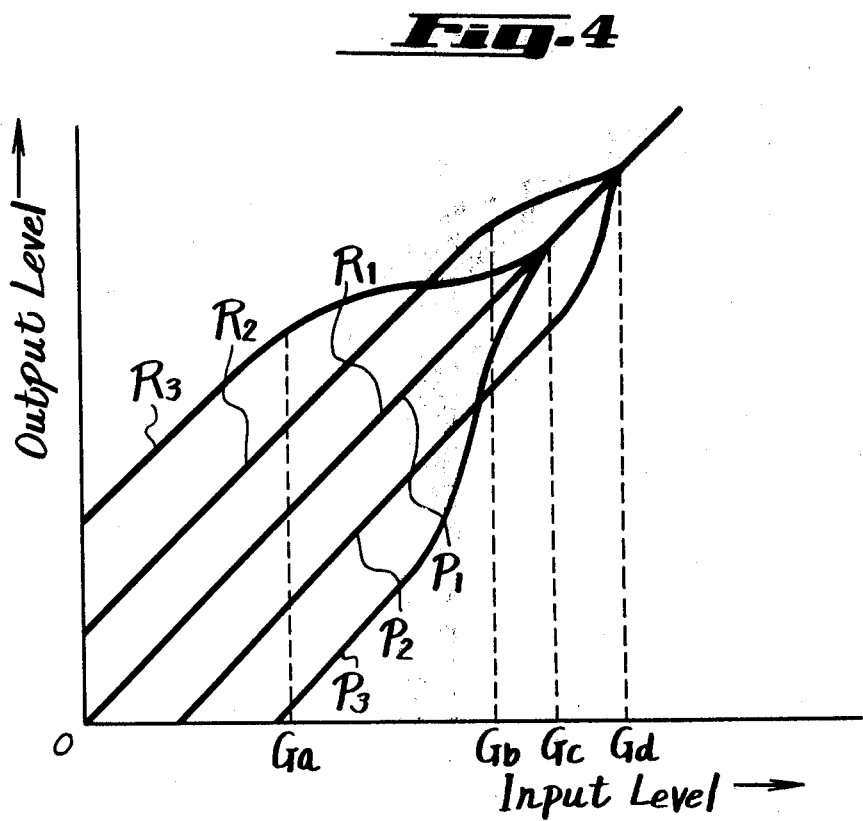

In short, the prior art noise reducing circuit for the tape recorder shown in FIG. 1 becomes operative in response to the level and frequency of the recording signal, and the input-output transfer characteristic from the terminal 1 to the terminal 5R for the recording signal is shown by the straight line $R_1$ in FIG. 4 for the low frequency band, by the curve $R_2$ in FIG. 4 for the intermediate frequency band on the basis of the straight line $R_1$, and by the curve $R_3$ in FIG. 4 for the high frequency band, also on the basis of the straight line $R_1$. In this case, the input to the control circuit 7 is obtained from the filter 6 so that a kind of automatic gain control is effected to cause the curves $R_2$ and $R_3$ to change in a smooth manner.

For reproduction, the switch 3 is changed over from the recording contact R to the reproduction contact P, and the reproduction signal is delivered from the terminal 5P. A part of the reproduction signal is fed back from the terminal 5P through the attenuator 8, filter 6, amplifier 9 and resistor 4 to the amplifier 2. That is, the filter 6 is connected in series with the negative feed back loop to the amplifier 2 so that the input-output transfer characteristic between the terminal 1 and the terminal 5P is completely reversed from that obtained during recording. As a result, the amplifier 2 is capable of operating as a variable high frequency band attenuating filter. The input-output transfer characteristic for the reproduction signal between the terminal 1 and the terminal 5P is shown by a straight line $P_1$ for the low frequency band (the straight line $P_1$ is coincident with the straight line $R_1$), is shown by a curve $P_2$ for the intermediate frequency band, and is shown by a curve $P_3$ for the high frequency band.

If the recording and reproduction are effected by the prior art circuit shown in FIGS. 1 and 2 and the level of the input signal is small for the intermediate and high frequency bands, the output level is intensified during recording and attenuated during reproduction. As a result, the prior art circuit has the advantage that a conspicuous noise produced for the intermediate and high frequency band, such as hiss and the like produced by a magnetic tape, can be decreased in the recording process so that an improved S/N can be obtained even when the level of the input signal is small. In addition, when the level of the input signal is large, the level is not intensified so that there is no risk of the recorded information on magnetic tape being distorted by saturation.

The invention will be now described with reference to FIGS. 5 and 6. In FIG. 5 is shown a recording circuit embodying the invention and in FIG. 6 is shown a reproduction circuit embodying the invention. In the figures, reference numeral 10 designates a noise reducing device which is the same as that described above with reference to FIGS. 1 to 4. As shown in FIG. 5, in making a recording, an output from a microphone 11 is supplied through a microphone amplifier 12 and a volume control 13 to a line amplifier 14. In the present embodiment, provision is made of a first switch 15 for changing over the noise reducing device 10 from its operative condition to its inoperative condition and vice versa and a second switch 16 operatively connected to the first switch 15 for changing the recording level. If movable contacts 15A and 16A of the switches 15 and 16 are connected to fixed contacts 15B and 16B, respectively, the recording signal, does not pass through the noise reducing device 10, but is directly supplied to a recording amplifier 17 and an amplifier 18. Conversely, if the movable contacts 15A and 16A of the switches 15 and 16 are connected to fixed contacts 15C and 16C, respectively, the recording signal does pass through the noise reducing device 10 to the recording amplifier 17 and the amplifier 18. In addition, the recording signal supplied to the recording amplifier 17 is attenuated by means of an attenuator consisting of resistors 19 and 20. The attenuation due to the attenuator 19 and 20 is given by $$xdB = 20 \log \frac{R_2}{R_1 + R_2}$$

wherein $R_1$ and $R_2$ are resistance values of the resistors 19 and 20, respectively. The maximum level of this amount $x$dB may be selected to be a level corresponding to the noise level to be reduced by the noise reducing device 10, but it is preferable to select a level on the order of 5dB, for example. To the recording amplifier 17 is connected a recording head 21 and to the amplifier 18 is connected a level meter 22.

During signal reproduction, the signal recorded in the manner described above is picked up by means of a reproduction head 23 and is supplied to a preamplifier 24. The reproduction signal from the preamplifier 24 is directly delivered to a fixed contact 25B of a switch 25 and through the noise reducing device 10 to second fixed contact of 25C of the switch 25. The arm of the switch 25 makes contact with either the fixed contact 25B to receive the input signal of the noise reducing device 10 or with the fixed contact 25C to receive the output signal of the device 10. A switch 26 is operatively connected to the switch 25 to provide for automatic adjustment of the level. The reproduction signal is supplied either from the fixed contact 25B of the switch 25 through an attenuator consisting of resistors 27 and 28 to a fixed contact 26B of the switch 26 or from the fixed contact 25C at the output of the noise reducing device 10 to a fixed contact 26C of the switch 26. The values of the resistors 27 and 28 are made equal to those of the resistors 19 and 20 shown in FIG. 5, respectively, and as a result, the amount to be attenuated by the attenuator 27, 28 is given by the same $x$dB. The reproduction signal is supplied from the switch 26 to a line amplifier 29 whose reproduction output signal is delivered to reproduction output terminals 30 and to the meter circuit consisting of the amplifier 18 and the level member 22.

In the embodiment shown in FIG. 5, if the noise reducing device 10 is by passed, the level meter 22 is capable of setting the recording level to be the same as that of the customary tape recorder. If the noise reducing device 10 is operatively connected into the circuit the movable contacts 15A and 16A are connected to the fixed contacts 15C and 16C, respectively, and the standard recording level can be reduced by $x$dB even when the recording level is set in the same manner as in the customary manner while viewing the level meter 22.

In case of reproducing the magnetic tape recorded as described above, the movable contacts 25A and 26A of the switches 25 and 26 are connected to the fixed contacts 25C and 26C, respectively, and as a result, the standard point of the reproduction level becomes raised by $x$dB. During reproduction, the level meter 22 indicates the level of the reproduction signal whose reproduction level has the standard point which is raised by $x$dB, for example, $5d$B.

As stated hereinbefore, the use of the noise reducing device 10 causes a decrease of the standard point of the recording level by $x$dB and an increase of the standard point of the reproduction level by $x$dB and provides the important advantage that the dynamic range of a cassette tape recorder can be widened in the same manner as in the case of an open reel tape recorder, and that the recording with least distortion can be effected.

In general, if the standard point of the recording level in a circuit that does not include the noise reducing device 10 is decreased, it is possible to widen the dynamic range. In that case, however, the S/N ratio becomes deteriorated. But the noise reducing device 10 can make the noise level smaller by substantially $10d$B than that of the conventional tape recorder, and as a result, the S/N ratio is not deteriorated to a valve which is inferior to the that obtained when the noise reducing device 10 is not used.

In addition, if use is made of the level meter 22 as described with reference to FIGS. 5 and 6, even when the standard point of the recording level is reduced by $x d$B the indication of the level meter 22 is not reduced by $x$dB, and as a result, it is possible to set the recording level in the same manner as in the prior art tape recorder in accordance with the indication of the level member 22.

Conversely, if the level of the signal supplied to the level meter 22 is raised by $x$dB, the dynamic range as widened by the invention can more efficiently be applied to the tape recorder.

We claim as our invention:

1. An amplifying system for tape apparatus, said system comprising: a noise reducing device that compresses signals to be recorded, the amount of compression being a function of signal frequency such as to be different for higher frequencies than for frequencies below a predetermined value, whereby output signals of the noise reducing device are favorably modified, in comparison with input signals to that device, for minimizing the effects of subsequently-introduced noise signals; a first switch connected to said noise reducing device and having a first condition to receive signals modified by said noise reducing device and a second condition to receive signals not modified by said noise reducing device; a second switch ganged with said first switch and having first and second conditions; and signal level modifying means connected to said second switch and energized by the output signal of said first switch and operative to change the output level of the signal from said second switch by xdB when both of said switches are in their first condition relative to the output when said switches are in their second condition.

2. An amplifying system according to claim 1 in which said signal level modifying means comprises an attenuator, and said second switch is connected to two points of different attenuation values on said attenuator, the difference of attenuation between said points being $x$db.

3. The amplifying system of claim 1 comprising a volume meter connected to said second switch to measure the maximum signal level applied to said second switch in either of said first and second conditions.

4. The amplifying system of claim 3 comprising a recording transducer and means connecting said recording transducer to said second switch to receive the output signal from said second switch.

5. The amplifying system of claim 4 comprising a playback transducer; a second noise reducing device; a third switch connected to said second noise reducing device and having a first condition to receive signals modified by said second noise reducing device and a second condition to receive signals not modified by said second noise reducing device; a fourth switch ganged with said third switch and having first and second conditions; and second signal level modifying means connected to said fourth switch and energized by the output signal of said third switch and operative to reduce the output level of the signal from said fourth switch by $x$dB when both of said third and fourth switches are in their second condition relative to the output level when both of said third and fourth switches are in their first condition.

6. The amplifying system of claim 1 comprising a playback transducer and means connecting said transducer to said noise reducing device, said signal level modifying means comprising an attenuator connected between said switches and comprising two points differing in attenuation values by xdB, said second switch comprising first and second fixed terminals and a movable arm, said first terminal being connected to the point of greater attenuation, and said arm engaging said first terminal in said first condition of said switches.

7. The amplifying system of claim 6 in which said first switch comprises a first terminal connected to the input of said noise reducing device, a second terminal connected to the output of said noise reducing device, and a movable arm engaging said first terminal thereof in said first condition and said second terminal thereof in said second condition, said arm of said first switch being connected to said attenuator and to said second terminal of said second switch.

8. The amplifying system of claim 7 comprising a volume meter and means connecting said volume meter of said arm of said second switch.

* * * * *